(12) United States Patent
Takamori

(10) Patent No.: US 7,567,082 B2
(45) Date of Patent: Jul. 28, 2009

(54) MAGNETIC RESONANCE IMAGING APPARATUS

(75) Inventor: Hiromitsu Takamori, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 11/653,931

(22) Filed: Jan. 17, 2007

(65) Prior Publication Data
US 2007/0164743 A1    Jul. 19, 2007

(30) Foreign Application Priority Data
Jan. 19, 2006    (JP)    ............................. 2006-011448

(51) Int. Cl.
*G01V 3/00*    (2006.01)
(52) U.S. Cl. ...................................... 324/318; 324/319
(58) Field of Classification Search .................. 324/318, 324/319, 321
See application file for complete search history.

(56) References Cited

U.S. PATENT DOCUMENTS

| | | | |
|---|---|---|---|
| 6,107,799 A | 8/2000 | Sellers et al. | |
| 6,404,200 B1 * | 6/2002 | Dietz et al. | 324/318 |
| 6,894,498 B2 * | 5/2005 | Edelstein | 324/318 |
| 7,191,513 B2 * | 3/2007 | Schuster et al. | 29/760 |
| 2004/0046555 A1 | 3/2004 | Schuster et al. | |

FOREIGN PATENT DOCUMENTS

| | | |
|---|---|---|
| JP | 63-246146 | 10/1988 |
| JP | 10-118043 | 5/1998 |

OTHER PUBLICATIONS

Office Action dated Nov. 14, 2008 in Chinese Patent Application No. 2007100039764 with English translation.

* cited by examiner

*Primary Examiner*—Louis M Arana
(74) *Attorney, Agent, or Firm*—Nixon & Vanderhye PC

(57) ABSTRACT

A magnetic resonance imaging apparatus includes a gantry with a gradient coil which applies a gradient magnetic field to a subject in a static magnetic field, a bed which slides a top board in a longitudinal direction of the top board with the subject placed thereon, a high-frequency coil which applies the gradient magnetic field and a high-frequency pulse signal to the subject, and detects a magnetic resonance signal emitted from the subject, and a damping member which damps noise which occurs when the gradient coil is driven, or a support member which supports the gradient coil, the damping member or the support member providing an asymmetrical structure with respect to a plane perpendicular to the longitudinal direction.

7 Claims, 4 Drawing Sheets

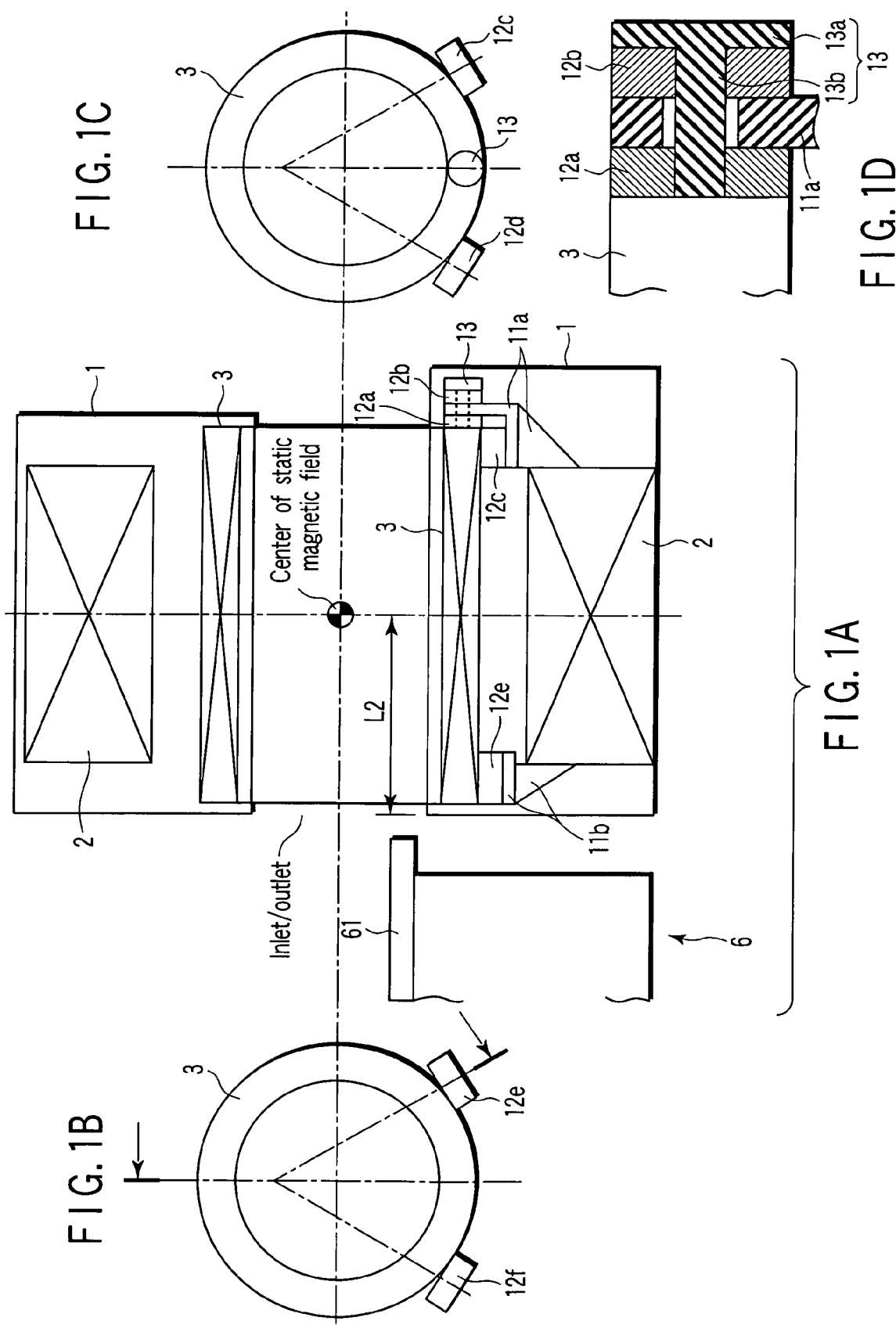

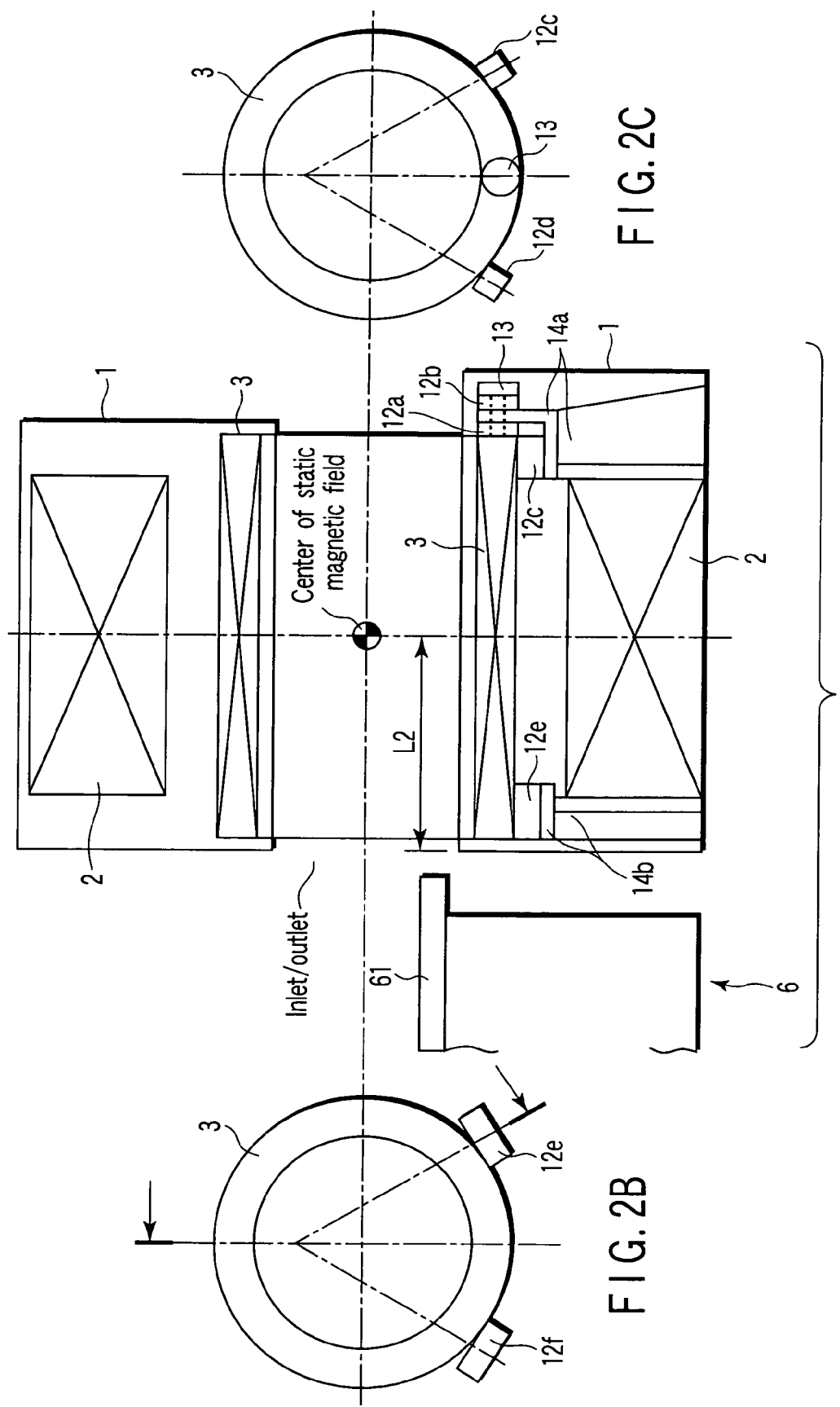

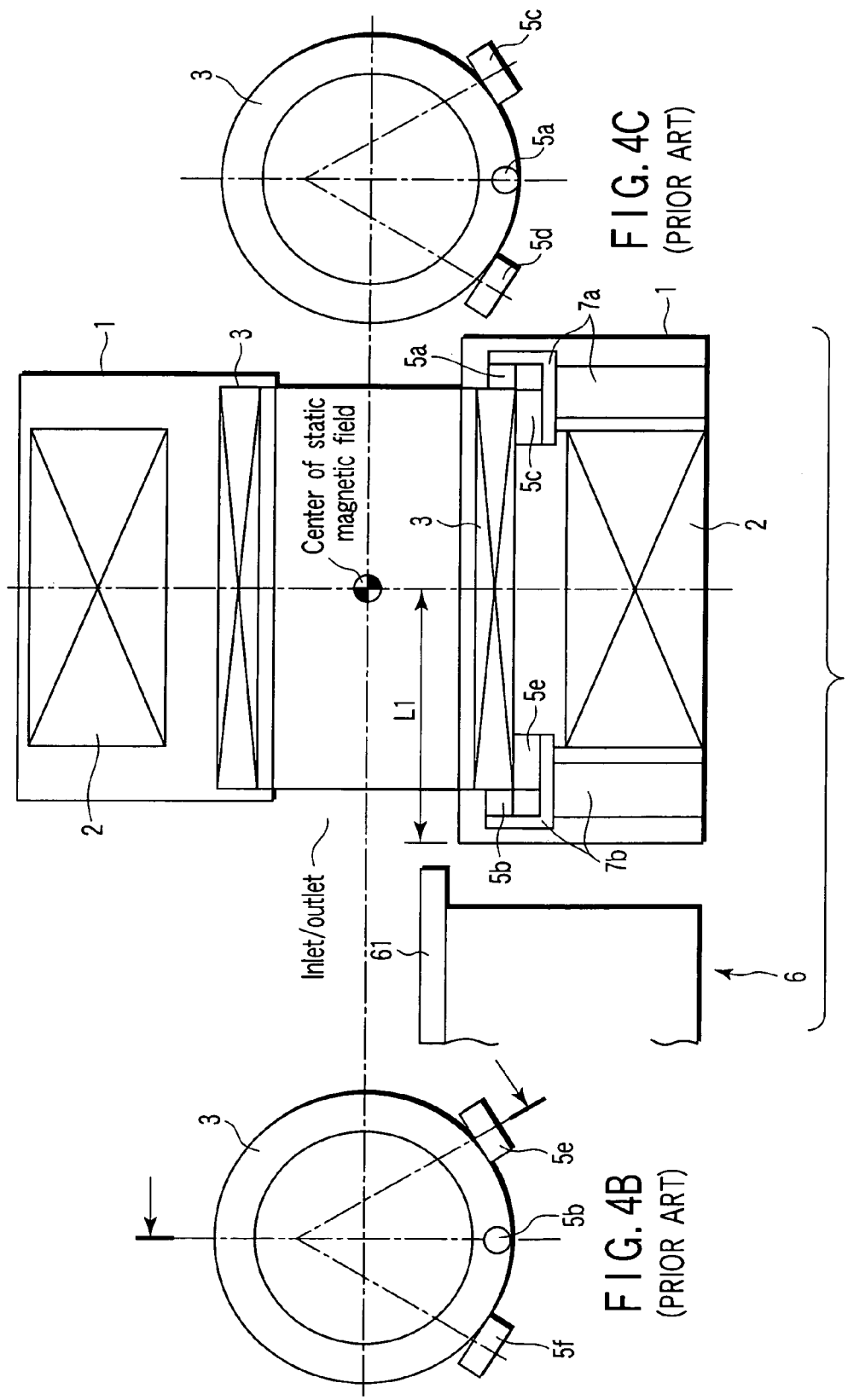

MAGNETIC RESONANCE IMAGING APPARATUS

CROSS-REFERENCE TO RELATED APPLICATIONS

This application is based upon and claims the benefit of priority from prior Japanese Patent Application No. 2006-011448, filed Jan. 19, 2006, the entire contents of which are incorporated herein by reference.

BACKGROUND OF THE INVENTION

1. Field of the Invention

The present invention relates to a magnetic resonance imaging (MRI) apparatus for medical diagnosis, and more particularly to a support structure for a gradient coil incorporated in the apparatus.

2. Description of the Related Art

MRI apparatuses are required to generate a very strong static magnetic field around a subject. A gradient field, which has its magnetism varied with time, is added to the static magnetic field. When a subject is exposed to a high-frequency magnetic field, the subject emits a high-frequency magnetic resonance signal. This signal is used to reconstruct a tomogram of the subject.

In general, the intensity of the static magnetic field must be set to about several kG to 10 kG (1T). Further, static magnetic field must have spatial uniformity, and generally needs a spatial uniformity of several tens of ppm or less. The spatial region required for a static magnetic field is, for example, a sphere with a diameter of 50 cm.

Recent MRI apparatuses are required to perform high-speed switching of their respective gradient fields and to increase the intensity of the fields in accordance with increases in the speed of processing in imaging techniques. MRI apparatuses may generate noise as a result of interaction of the current flowing through their gradient coils and the static magnetic field. This noise has been more and more increased under the above-described circumstances, and has reached 100 dB(A) or more. Accordingly, it is necessary to employ countermeasures against noise (such as the use of earplugs or ear defenders) to subjects of imaging.

Such noise includes air-propagated noise, and a solid-propagated noise transmitted through solid materials that contact the gradient coil. As general noise reduction methods, there is a method for surrounding a gradient coil with a sound absorbing or blocking member, and a method for sealing the gradient coil itself in a vacuum container in an airtight manner (see, for example, Jpn. Pat. Appln. KOKAI Publication No. 63-246146, Jpn. Pat. Appln. KOKAI Publication No. 10-118043, or U.S. Pat. No. 5,793,210).

Further, to reduce the level of noise caused by solid-propagated sound, it has been attempted to reduce the rate of transmission of vibration to a magnet generating a static magnetic field, by supporting the gradient coil with vibration-proof rubber.

FIGS. 3A to 3C show the structure of a magnet-support-type magnet gantry employed in a conventional MRI apparatus.

The magnet gantry comprises a housing 1, and a magnet 2 for generating a static magnetic field and a gradient coil 3 contained in the housing 1. The gradient coil 3 is supported by the static field magnet 2 via support members 4a and 4b and damping members 5a, 5b, 5c, 5d, 5e and 5f.

A bed 6 has a top board 61 on which a subject (not shown) is placed. When the top board 61 is moved, the subject is inserted through one opening of the gradient coil 3 into the internal space of the coil 3, or pulled out of the space through the one opening. The top board 61 is moved along the axis (Z axis) of the static field magnet 2 and gradient coil 3. The above-mentioned opening is used as an inlet/outlet for the subject. The above-mentioned opening is situated near the bed 6 when viewed from the magnet gantry.

The support members 4a and 4b are attached to the opposite ends of the static field magnet 2. In other words, the support members 4b and 4a are provided near and away from the bed, respectively.

The damping members 5a and 5b are provided between one end of the gradient coil 3 and the support member 4a and between the other end of the coil 3 and the support member 4b, respectively, and damp the Z component of vibration of the coil 3. The damping members 5c and 5d and damping members 5e and 5f are provided near and away from the bed, respectively. Further, as shown in FIGS. 3B and 3C, the damping members 5c, 5d, 5e and 5f are in contact with the periphery of the gradient coil 3 from obliquely below to damp the X- and Y-directional vibration of the gradient coil 3.

Thus, the support member 4b is a reflection of the support member 4a with respect to the center of the static magnetic field near and away from the bed. Similarly, the damping members 5a, 5c and 5d are a reflection of the damping members 5b, 5e and 5f with respect to the center of the static magnetic field near and away from the bed. As a result, the support members 4a and 4b support the gradient coil 3 in a non-coupled manner.

FIGS. 4A, 4B and 4C show the structure of the floor-support-type magnet gantry of a conventional MRI apparatus. In this structure, elements similar to those shown in FIGS. 3A to 3C are denoted by corresponding reference numbers, and no detailed description is given thereof.

The floor-support-type magnet gantry differs from the magnet gantry shown in FIGS. 3A to 3C in that the former employs support members 7a and 7b instead of the support members 4a and 4b.

The support members 7b and 7a are provided near and away from the bed, respectively, and fix the opposite ends of the gradient coil 3 to the floor of the housing 1.

Like the support members 4a and 4b, the support member 7b is a reflection of the support member 7a with respect to the center of the static magnetic field near and away from the bed. Further, the damping members 5a, 5c and 5d are a reflection of the damping members 5b, 5e and 5f with respect to the center of the static magnetic field near and away from the bed. As a result, the support members 7a and 7b support the gradient coil 3 in a non-coupled manner.

In recent years, there is a demand for reducing the Z-dimension of the magnet gantry to improve the interior comfort of the apparatus, to reduce the length of the entire apparatus including the bed, and hence reduce the space required for installing the apparatus, or to reduce the distance to the center of the magnetic field to thereby reduce the distance of movement of a subject and accordingly enhance throughput.

However, in the magnet gantry constructed as above, since the support members and damping members Z-axially project from the side of the gradient coil 3 positioned near the bed, the distance L1 between the inlet of the magnet gantry and the center of the static magnetic field is inevitably great, which acts against satisfying the above demand.

BRIEF SUMMARY OF THE INVENTION

Under the above circumstances, there is a demand for reducing the distance between the inlet of the magnet gantry and the center of the static magnetic field.

According to a first aspect of the present invention, there is provided a magnetic resonance imaging apparatus comprising: a gantry with a gradient coil which applies a gradient magnetic field to a subject in a static magnetic field; a bed which slides a top board in a longitudinal direction of the top board with the subject placed thereon; a high-frequency coil which applies the gradient magnetic field and a high-frequency pulse signal to the subject, and detects a magnetic resonance signal emitted from the subject; and a damping member which damps noise which occurs when the gradient coil is driven, or a support member which supports the gradient coil, the damping member or the support member providing an asymmetrical structure with respect to a plane perpendicular to the longitudinal direction.

According to a second aspect of the present invention, there is provided a magnetic resonance imaging apparatus comprising: a static field generator which generates a static magnetic field in a diagnosis space; a gradient coil which generates a gradient magnetic field in the static magnetic field; a movement unit which moves a subject in a direction in which the subject is inserted into and pulled out of the diagnosis space; and a supporter which supports the gradient coil, the supporter including at least one damping member located to provide an asymmetrical structure with respect to a plane perpendicular to the first direction.

According to a third aspect of the present invention, there is provided a magnetic resonance imaging apparatus comprising: a static field generator which generates a static magnetic field in a diagnosis space; a gradient coil which generates a gradient magnetic field in the static magnetic field; a movement unit which moves a subject in a first direction in which the subject is inserted into and pulled out of the diagnosis space through an inlet/outlet of the diagnosis space; and a supporter which supports the gradient coil, the supporter including: a first damping member and a second damping member provided in the first direction; and a first support member and a second support member which support the first and second damping members on a floor, and have different thicknesses in the first direction.

According to a fourth aspect of the present invention, there is provided a magnetic resonance imaging apparatus comprising: a static field generator which generates a static magnetic field in a diagnosis space; a gradient coil which generates a gradient magnetic field in the static magnetic field; a movement unit which moves a subject in a direction in which the subject is insert into and pulled out of the diagnosis space through an inlet/outlet of the diagnosis space; and a supporter which supports the gradient coil, the supporter including a first damping member providing near an end of the gradient coil away from the inlet/outlet in the first direction, and preventing the gradient coil from vibrating in the first direction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the preferred embodiments given below, serve to explain the principles of the invention.

FIGS. 1A to 1D are views illustrating an essential part of an MRI apparatus according to a first embodiment;

FIGS. 2A to 2C are views illustrating an essential part of an MRI apparatus according to a second embodiment;

FIGS. 4A to 4C are views illustrating the structure of a floor-support-type magnet gantry incorporated in a conventional MRI apparatus.

DETAILED DESCRIPTION OF THE INVENTION

Figures 3A, 3B, 3C:
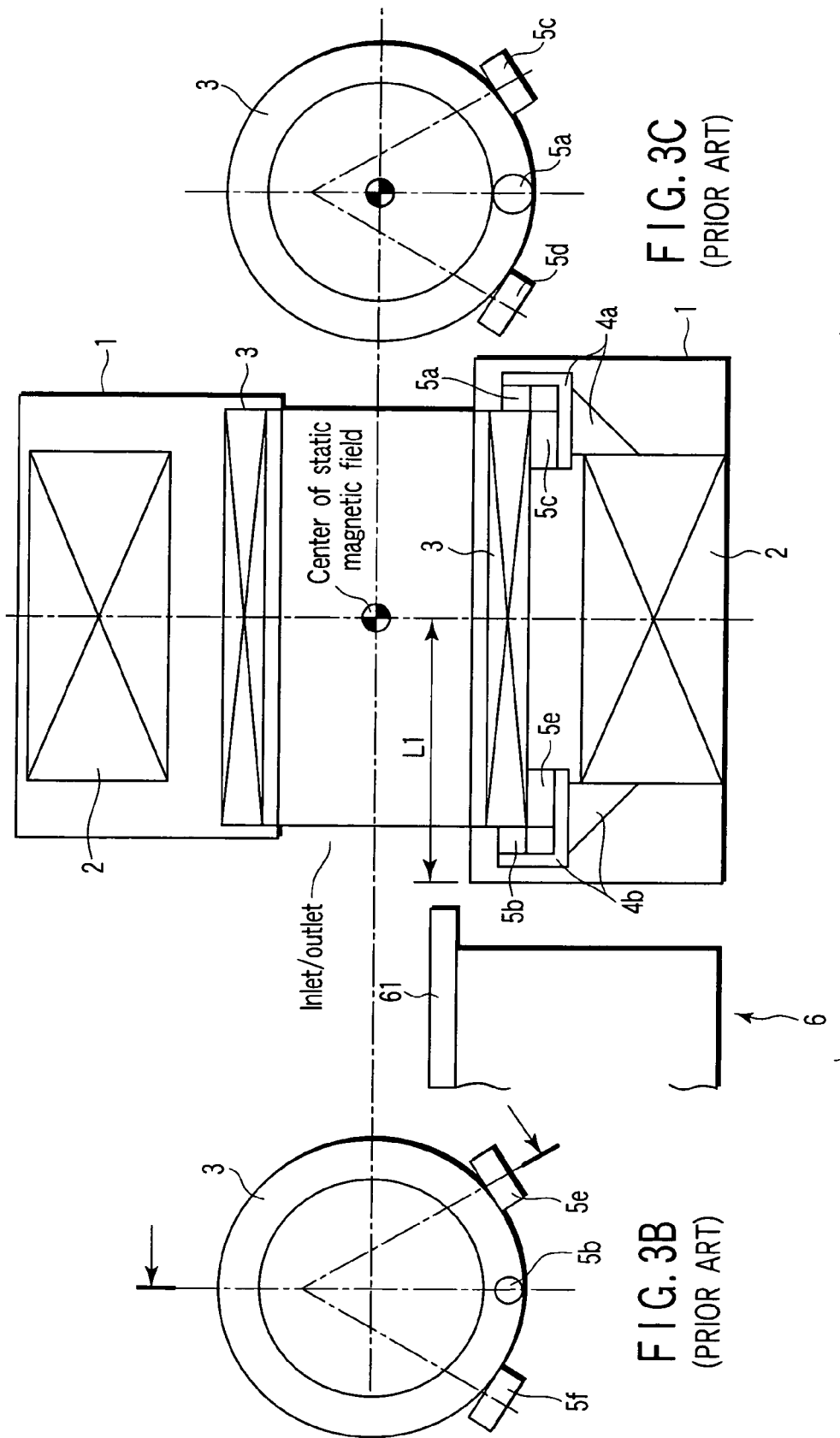
FIGS. 3A to 3C are views illustrating the structure of a magnet-support-type magnet gantry incorporated in a conventional MRI apparatus.

Embodiments will be described with reference to the accompanying drawings.

First Embodiment

FIGS. 1A to 1D are views illustrating an essential part of an MRI apparatus according to a first embodiment. In these figures, elements similar to those shown in FIGS. 3A to 3C are denoted by corresponding reference numbers. Although FIGS. 1A to 1D show, in detail, the structure of the a magnet gantry incorporated in the MRI apparatus, and do not show many other structural elements, the MRI apparatus of the first embodiment is provided with various elements that are also incorporated in most known MRI apparatuses.

The magnet gantry comprises a housing 1, and a cylindrical magnet 2 that generates a static magnetic field, and a cylindrical gradient coil 3, which are contained in the housing 1. The static field magnet 2 is fixed at the floor of the housing 1. The gradient coil 3 is located in the internal space of the static field magnet 2 so that the static field magnet 2 and gradient coil 3 are substantially coaxial. The gradient coil 3 is supported by the static field magnet 2 via support members 11a and 11b and damping rubbers 12a to 12f.

A bed 6 has a top board 61 on which a subject (not shown) is placed. When the top board 61 is moved substantially along the axis of the gradient coil 3 (i.e., to the right in FIG. 1A), the subject placed on the board 61 is inserted through one opening (i.e., inlet/outlet) of the gradient coil 3 into the internal space of the coil 3, or pulled out of the space through the inlet/outlet. The top board 61 is moved along the axes of the cylindrical static field magnet 2 and gradient coil 3. The direction of the axes is generally called the Z-direction. The other two directions perpendicular to the Z-direction are called the X- and Y-directions.

The support members 11a and 11b are attached to the opposite ends of the static field magnet 2. In other words, the support members 11b and 11a are provided near and away from the bed, respectively.

The damping rubber 12a is provided between one end of the gradient coil 3 and the support member 11a. The damping rubber 12b is provided between the support member 11a and a planar portion 13a incorporated in a pressing member 13. It is desirable to make the damping rubbers 12b be a reflection of the damping rubbers 12a with respect to the Z-axis. The pressing member 13 includes the planar portion 13a, which is flat and cylindrical, and an axial portion 13b projecting from the planar portion 13a. The axial portion 13b extends through the holes formed in the damping rubbers 12a and 12b, and has its distal end fixed to one end of the gradient coil 3.

The damping rubbers 12c and 12d and damping rubbers 12e and 12f are provided away and near from the bed, respectively. Further, as shown in FIGS. 1B and 1C, the damping rubbers 12c, 12d, 12e and 12f are in contact with the periphery of the gradient coil 3 from obliquely below. The damping rubbers 12c and 12d are made smaller than the damping rubbers 12e and 12f to impart them different spring constants. The contact position of the damping rubber 12d on the gradient coil 3 is a reflection of that of the damping rubber 12c on the gradient coil 3 with respect to the axis of the gradient coil 3. Similarly, the contact position of the damping rubber 12f on the gradient coil 3 is a reflection of that of the damping rubber 12e on the gradient coil 3 with respect to the axis of the gradient coil 3. Namely, the damping rubbers 12c and 12e are arranged in a line parallel to the axis of the gradient coil 3, while the damping rubbers 12d and 12f are arranged in another line parallel to the axis of the gradient coil 3. All damping rubbers 12c to 12f are arranged so that the same angle is formed between the line perpendicular to the contact surface of each damping rubber and the line perpendicular to the core of the gradient coil 3.

Constructed as above, the pressing force of the gradient coil 3 exerted on the support member 11a when the gradient coil 3 is moved away from the bed in the Z-direction is reduced by the damping rubber 12a. Similarly, the pressing force of the gradient coil 3 exerted on the support member 11a when the gradient coil 3 is moved toward the bed in the Z-direction is reduced by the damping rubber 12b. As a result, the Z-directional vibration of the gradient coil 3 is damped.

The X- and Y-directional vibrations of the gradient coil 3 are damped by the damping rubbers 12c, 12d, 12e and 12f. Further, by virtue of the structure as shown in FIG. 1D, the damping rubbers 12a and 12b also have a function of damping the X- and Y-directional vibrations of the gradient coil 3. To prevent torques from occurring with respect to the principal axes of inertia exerted toward and away from the bed, the damping rubbers 12e and 12f located near the bed are made larger than the damping rubbers 12c and 12d located away from the bed. It is preferable to appropriately set the difference in size between the damping rubbers 12e and 12f and the damping rubbers 12c and 12d in light of the X- and Y-directional spring components of the damping rubbers 12a and 12b.

As described above, in the first embodiment, the vibrations of the gradient coil 3 in the three perpendicular directions can be damped. Further, in the first embodiment, the damping rubbers 12a and 12b for damping the Z-directional vibration are provided only away from the bed. This enables the inlet/outlet of the magnet gantry to be made closer to one end of the gradient coil 3, and hence enables the distance L2 between the inlet/outlet and the center of the static magnetic field to be shorter than the conventional distance L1. As a result, the interior comfort of the apparatus for a subject is improved, the length of the entire apparatus including the bed can be reduced to reduce the space required for installing the apparatus, or the distance to the center of the magnetic field can be reduced to thereby reduce the distance of movement of a subject and accordingly to enhance, for example, throughput.

Further, in the first embodiment, since the damping rubbers 12e and 12f are made larger than the damping rubbers 12c and 12d, non-coupled supporting can be realized so as to prevent torques from occurring with respect to the principal axes of inertia exerted toward and away from the bed.

Second Embodiment

FIGS. 2A to 2C are views illustrating an essential part of an MRI apparatus according to a second embodiment. In these figures, elements similar to those shown in FIGS. 1A to 1D are denoted by corresponding reference numbers. Although FIGS. 2A to 2C show, in detail, the structure of the a magnet gantry incorporated in the MRI apparatus, and do not show many other structural elements, the MRI apparatus of the second embodiment is provided with various elements that are also incorporated in most known MRI apparatuses.

The MRI apparatus of the second embodiment differs from that of the first embodiment in that the former employs support members 14a and 14b instead of the support members 11a and 11b.

The support members 14a and 14b are provided near and away from the bed, respectively, and support the opposite ends of the gradient coil 3 on the floor of the housing 1.

The upper ends of the support members 14a and 14b have the same shape as those of the support members 11a and 11b, and the damping rubbers 12a to 12f are provided in the same way as in the first embodiment.

The support member 14a is thicker than the support member 14b in the Z-direction. The Z-directional thickness of the support member 14a gradually increases downward.

Thus, the pressing force of the gradient coil 3 exerted on the support member 14a when the coil 3 is moved toward the side away from the bed in the Z-direction is reduced by the damping rubber 12a. Similarly, the pressing force of the gradient coil 3 exerted on the support member 14a when the coil 3 is moved toward the side close to the bed in the Z-direction is reduced by the damping rubber 12b. Thus, the Z-directional vibration of the gradient coil 3 can be damped.

As a result of the above effects, greater pressure is exerted on the support member 14a than on the support member 14b when the gradient coil 3 is moved in the Z-direction. However, since the support member 14a has a thicker Z-directional thickness, it can bear the pressure. On the other hand, almost no pressure is exerted on the support member 14b when the gradient coil 3 is moved in the Z-direction. Therefore, it is sufficient if the Z-directional thickness of the support member 14b has strength that can bear the weight of the gradient coil 3 itself and the X- and Y-directional transitional forces. This means that the Z-directional thickness can be reduced. As a result, the projection amount of the support member 14b from the corresponding end of the gradient coil 3 can be minimized. Depending upon the positional relationship between the static field magnet 2 and gradient coil 3, the projection can be completely eliminated as shown in FIG. 2A. Namely, the inlet/outlet of the magnet gantry can be made closer to the corresponding end of the gradient coil 3, i.e., the distance L2 between the inlet/outlet and the center of the static magnetic field can be made shorter than the conventional distance L1. This enables the interior comfort of the apparatus for a subject to be improved, the length of the entire apparatus including the bed to be reduce to thereby reduce the space required for installing the apparatus, or the distance to the center of the magnetic field to be reduce to thereby reduce the distance of movement of a subject and accordingly enhance throughput.

The above-described embodiments can be modified in various ways as follows:

In each embodiment, the structure, which includes part of the support member 11a, the damping rubbers 12a and 12b and the pressing member 13, may also be provided near the bed. In this case, however, the Z-directional thickness of the structure provided near the bed must be thinner than that of the structure provided away from the bed.

In each embodiment, to realize non-coupled supporting, the damping rubbers 12c and 12d may be made different from the damping rubbers 12e and 12f in hardness or arrangement angle (i.e., their contact position on the gradient coil 3), as well as in size. Alternatively, all of the hardness, arrangement angle and size may be changed systematically.

When in each embodiment, non-coupled supporting is not needed, the damping rubbers 12c and 12d may be a reflection of the damping rubbers 12e and 12f.

In each embodiment, the arrangement of damping rubbers may be reversed at the positions near and away from the bed.

In each embodiment, the damping rubbers may be replaced with damping members formed of a material other than rubber.

In the second embodiment, the positions of the damping rubbers may be arbitrarily changed.

In the second embodiment, the Z-directional thickness of the support member 14b may be made greater than that of the support member 14a.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a static field generator which generates a static magnetic field in a diagnosis space;
   a gradient coil which generates a gradient magnetic field in the static magnetic field;
   a movement unit which moves a subject in a first direction in which the subject is inserted into and pulled out of the diagnosis space through an inlet/outlet of the diagnosis space; and
   a supporter which supports the gradient coil,
   the supporter including:
      a first damping member and a second damping member provided in the first direction; and
      a first support member and a second support member which support the first and second damping members on a floor, and have different thicknesses in the first direction.

2. The magnetic resonance imaging apparatus according to claim 1, wherein the first support member is provided closer to the inlet/outlet than the second support member, and a thickness of the first support member is thinner than a thickness of the second support.

3. The magnetic resonance imaging apparatus according to claim 2, wherein the first support member bears only vibration occurring in a second direction perpendicular to the first direction, and vibration occurring in a third direction perpendicular to the first and second directions.

4. A magnetic resonance imaging apparatus comprising:
   a static field generator which generates a static magnetic field in a diagnosis space;
   a gradient coil which generates a gradient magnetic field in the static magnetic field;
   a movement unit which moves a subject in a direction in which the subject is inserted into and pulled out of the diagnosis space; and
   a supporter which supports the gradient coil, the supporter including at least one damping member located to provide an asymmetrical structure with respect to a plane perpendicular to the first direction;
   wherein the supporter also includes:
   a first damping member provided near the inlet/outlet and prevents the gradient coil from vibrating in a second direction and a third direction perpendicular to each other and to the first direction; and
   a second damping member provided near an end of the gradient coil away from the inlet/outlet in the first direction, and prevents the gradient coil from vibrating in the second and third directions, the second damping member having a spring constant different from a spring constant of the first damping member.

5. A magnetic resonance imaging apparatus comprising:
   a static field generator which generates a static magnetic field in a diagnosis space;
   a gradient coil which generates a gradient magnetic field in the static magnetic field;
   a movement unit which moves a subject in a direction in which the subject is inserted into and pulled out of the diagnosis space; and
   a supporter which supports the gradient coil, the supporter including at least one damping member located to provide an asymmetrical structure with respect to a plane perpendicular to the first direction;
   wherein the supporter also includes:
   a first damping member provided in contact with the gradient coil near the inlet/outlet and prevents the gradient coil from vibrating in a second direction and a third direction perpendicular to each other and to the first direction; and
   a second damping member provided in contact with the gradient coil near an end of the gradient coil away from the inlet/outlet in the first direction, and prevents the gradient coil from vibrating in the second and third directions,
   the first and second damping members contacting the gradient coil at different positions.

6. A magnetic resonance imaging apparatus comprising:
   a static field generator which generates a static magnetic field in a diagnosis space;
   a gradient coil which generates a gradient magnetic field in the static magnetic field;
   a movement unit which moves a subject in a first direction in which the subject is insert into and pulled out of the diagnosis space through an inlet/outlet of the diagnosis space; and
   a supporter which supports the gradient coil, the supporter including a first damping member providing near an end of the gradient coil away from the inlet/outlet in the first direction, and preventing the gradient coil from vibrating in the first direction;
   wherein the supporter further comprises:
   a second damping member provided near the inlet/outlet and prevents the gradient coil from vibrating in a second direction and a third direction perpendicular to each other and to the first direction; and
   a third damping member provided near an end of the gradient coil away from the inlet/outlet in the first direction, and prevents the gradient coil from vibrating in the second and third directions, the third damping member having a spring constant different from a spring constant of the second damping member in light of spring components of the first damping member occurring in the second and third directions.

7. A magnetic resonance imaging apparatus comprising:
a static field generator which generates a static magnetic field in a diagnosis space;
a gradient coil which generates a gradient magnetic field in the static magnetic field;
a movement unit which moves a subject in a first direction in which the subject is insert into and pulled out of the diagnosis space through an inlet/outlet of the diagnosis space; and
a supporter which supports the gradient coil, the supporter including a first damping member providing near an end of the gradient coil away from the inlet/outlet in the first direction, and preventing the gradient coil from vibrating in the first direction;
wherein the supporter also includes:
a second damping member provided in contact with the gradient coil near the inlet/outlet and prevents the gradient coil from vibrating in a second direction and a third direction perpendicular to each other and to the first direction; and
a third damping member provided in contact with the gradient coil near an end of the gradient coil away from the inlet/outlet in the first direction, and prevents the gradient coil from vibrating in the second and third directions,
the second and third damping members contacting the gradient coil at different positions in light of spring components of the first damping member occurring in the second and third directions.

\* \* \* \* \*